United States Patent
Keigler et al.

(10) Patent No.: US 10,283,396 B2
(45) Date of Patent: May 7, 2019

(54) WORKPIECE HOLDER FOR A WET PROCESSING SYSTEM

(71) Applicant: ASM NEXX, Inc., Billerica, MA (US)

(72) Inventors: Arthur Keigler, Wellesley, MA (US); David G. Guarnaccia, Carlisle, MA (US)

(73) Assignee: ASM NEXX, INC., Billerica, MA (US)

( * ) Notice: Subject to any disclaimer, the term of this patent is extended or adjusted under 35 U.S.C. 154(b) by 248 days.

(21) Appl. No.: 15/193,595

(22) Filed: Jun. 27, 2016

(65) Prior Publication Data

US 2017/0372937 A1 Dec. 28, 2017

(51) Int. Cl.
- *B23Q 3/00* (2006.01)
- *H01L 21/687* (2006.01)
- *C25D 17/00* (2006.01)
- *C25D 17/06* (2006.01)

(52) U.S. Cl.
CPC ...... *H01L 21/68721* (2013.01); *C25D 17/001* (2013.01); *C25D 17/004* (2013.01); *C25D 17/06* (2013.01); *H01L 21/68707* (2013.01)

(58) Field of Classification Search
USPC ........................................ 269/20, 55, 56, 86
See application file for complete search history.

(56) References Cited

U.S. PATENT DOCUMENTS

| | | | | |
|---|---|---|---|---|
| 2004/0010933 | A1* | 1/2004 | Mertens | B08B 3/04 34/380 |
| 2006/0076241 | A1* | 4/2006 | Schneider | C25D 17/06 205/118 |
| 2012/0305192 | A1 | 12/2012 | Keigler et al. | |
| 2012/0308346 | A1* | 12/2012 | Keigler | H01L 21/67028 414/222.09 |
| 2015/0357213 | A1* | 12/2015 | Yokoyama | H01L 21/67086 438/747 |
| 2017/0303448 | A1* | 10/2017 | Iisaka | H05K 13/0069 |
| 2017/0370017 | A1 | 12/2017 | Keigler et al. | |
| 2017/0372938 | A1 | 12/2017 | Keigler et al. | |

FOREIGN PATENT DOCUMENTS

| | | |
|---|---|---|
| WO | 99/08057 A2 | 2/1999 |
| WO | 01/18470 A1 | 3/2001 |

OTHER PUBLICATIONS

International Search Report and Written Opinion dated Sep. 28, 2017 in PCT/US2017/038367 (9 pages).

* cited by examiner

Primary Examiner — Joseph J Hail
Assistant Examiner — Shantese McDonald
(74) Attorney, Agent, or Firm — Ostrolenk Faber LLP (57) ABSTRACT

Techniques herein provide a workpiece holder that can hold relatively flexible and thin workpieces for transport and electrochemical deposition while avoiding electroplating fluid wetting contacts or contact regions of a given workpiece. A workpiece holder frame holds a workpiece by gripping the workpiece on opposing sides of the workpiece. A flexure structure is used for clamping a given workpiece and for providing an electrical path for supplying a current to the workpiece. An elastomer covering provides sealing and insulation of the electrical flexure structure. The workpiece holder also provides tension to the workpiece to help hold the workpiece flat during processing. Each flexure structure can provide an independent electrical path to the workpiece surface.

18 Claims, 8 Drawing Sheets

WORKPIECE HOLDER FOR A WET PROCESSING SYSTEM

BACKGROUND OF THE INVENTION

This invention relates to methods and systems for electro-chemical deposition including electroplating of semiconductor substrates. More specifically, this invention relates to systems and methods for holding, handling, and transporting thin substrates.

Electro-chemical deposition, among other processes, is used as a manufacturing technique for the application of films to various structures and surfaces, such as to semiconductor wafers, silicon workpieces or thin panels. Such films can include tin silver, nickel, copper or other metal layers. Electro-chemical deposition involves positioning a substrate within a solution that includes metal ions, and then applying an electrical current to cause metal ions from the solution to be deposited on the substrate. Typically, electrical current flows between two electrodes, namely, between a cathode and an anode. When a substrate is used as the cathode, metal can be deposited thereon. A plating solution can include one or more metal ion types, acids, chelating agents, complexing agents, and any of several other types of additives that assist with plating a particular metal. Deposited metal films can include metal and metal alloys, such as tin, silver, nickel, copper, etc., and alloys thereof.

SUMMARY

Electro-chemical deposition systems typically involve transporting substrates to a tank of plating fluid, plating one or more metals on the substrates via an electrical current, and then removing the substrates from the tank for further processing. Effective transporting and handling of various substrates is beneficial to properly plate substrates and to prevent damage to substrates. Transporting and holding various types of substrates can be challenging depending on substrate size, thickness, flexibility, etc. Two conventional types of substrate geometries include semiconductor wafers, which are characterized by relatively rigid silicon circular disks, and panel type geometries, which are characterized by typically larger and more flexible rectangular shaped substrates.

Techniques herein provide a workpiece holder that can hold relatively flexible and thin substrates for transport and electrochemical deposition. One embodiment includes a workpiece holder frame configured to hold a workpiece by gripping the workpiece on opposing sides of the workpiece. The workpiece holder frame has a header member configured to be gripped and transported to and from a processing cell capable of processing the workpiece on opposing surfaces of the workpiece. A first flexure leg extends from a first end of the header member and is configured to grip a first edge of the workpiece. The first flexure leg has a first pair of flexure contact seal strips attached along a length of the first flexure leg such that, when in use, an inner edge of the first pair of flexure contact seal strips sealably contacts opposing sides of the first edge of the workpiece and clamps the first edge there between. A second flexure leg extends from a second end of the header member and is configured to grip a second edge of the workpiece. The second flexure leg has a second pair of flexure contact seal strips attached along a length of the second flexure leg such that, when in use, an inner edge of the second pair of flexure contact seal strips sealably contacts opposing sides of the second edge of the workpiece and clamps the second edge there between.

Another embodiment includes a header member that is elongated. The header member has a first end and a second end that are longitudinally opposite each other. A first leg member extends from the first end of the header member and is perpendicular to the header member. A second leg member extends from the second end of the header member and is perpendicular to the header member such that the first leg member and the second leg member extend in a same direction and are in plane with each other. The first leg member having a first clamping mechanism and the second leg member having a second clamping mechanism. Each clamping mechanism has opposing clamping contacts that are electrically conductive. Each clamping mechanism is configured to apply a constant clamping force between the opposing clamping contacts. Each clamping mechanism is configured such that the opposing clamping contacts are sufficiently separable to receive a workpiece between the opposing clamping contacts. Each clamping mechanism having sufficient force to hold the workpiece including planar workpieces. Each clamping mechanism includes a seal configured to provide a fluid seal around the opposing clamping contacts when the opposing clamping contacts are holding the workpiece. The clamping mechanisms being configured to hold the workpiece between the first leg member and the second leg member. When the workpiece is held between the first leg member and the second leg member, the workpiece provides an electrical path between clamping contacts of the first leg member and clamping contacts of the second leg member such that an electrical current applied to either clamping mechanism travels through the workpiece when the workpiece includes a conductive surface.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein provide a workpiece holder that can hold relatively flexible and thin workpieces for transport and electrochemical deposition. Proper holding, transport, and manipulation of workpieces is beneficial to provide electrically deposited films that are uniform or that have targeted deposition areas. Electrochemical deposition can be performed on conventional semiconductor wafers, which are typically silicon discs of various diameters, such as 300 mm. Other workpieces include comparatively flexible panels, which can be rectangular in shape. Example panel workpieces can have heights and widths of 300 to 700 mm, with thicknesses ranging between 0.2 mm to 2 mm. As can be appreciated, handling such workpieces can be challenging. Such workpieces can have warpage of six or more millimeters, and, depending on a thickness, can require careful handling.

Techniques herein provide systems and methods that hold a workpiece to provide reliable electrical contact while avoiding electroplating fluid wetting contacts or contact regions of a given workpiece. One embodiment includes a workpiece holder frame configured to hold a workpiece by gripping the workpiece on opposing sides of the workpiece. In general, workpiece holders herein use a flexure structure for clamping a given workpiece. This flexure structure also provides an electrical path for supplying a current to the workpiece. An elastomer covering provides sealing and insulation of the electrical flexure structure. The flexibility and configuration of the flexure structure provides a spring action or stored mechanical energy to passively hold the workpiece and create a seal at a contact location between the workpiece and the elastomer. Thus no active force or energy input is need to hold the workpiece, though an active input is needed to open the flexure structure or clamping mechanism to receive or release a workpiece. The workpiece holder also provides tension to the workpiece to help hold the workpiece flat during processing. Each flexure structure can provide an independent electrical path to the workpiece surface.

Figure 1:
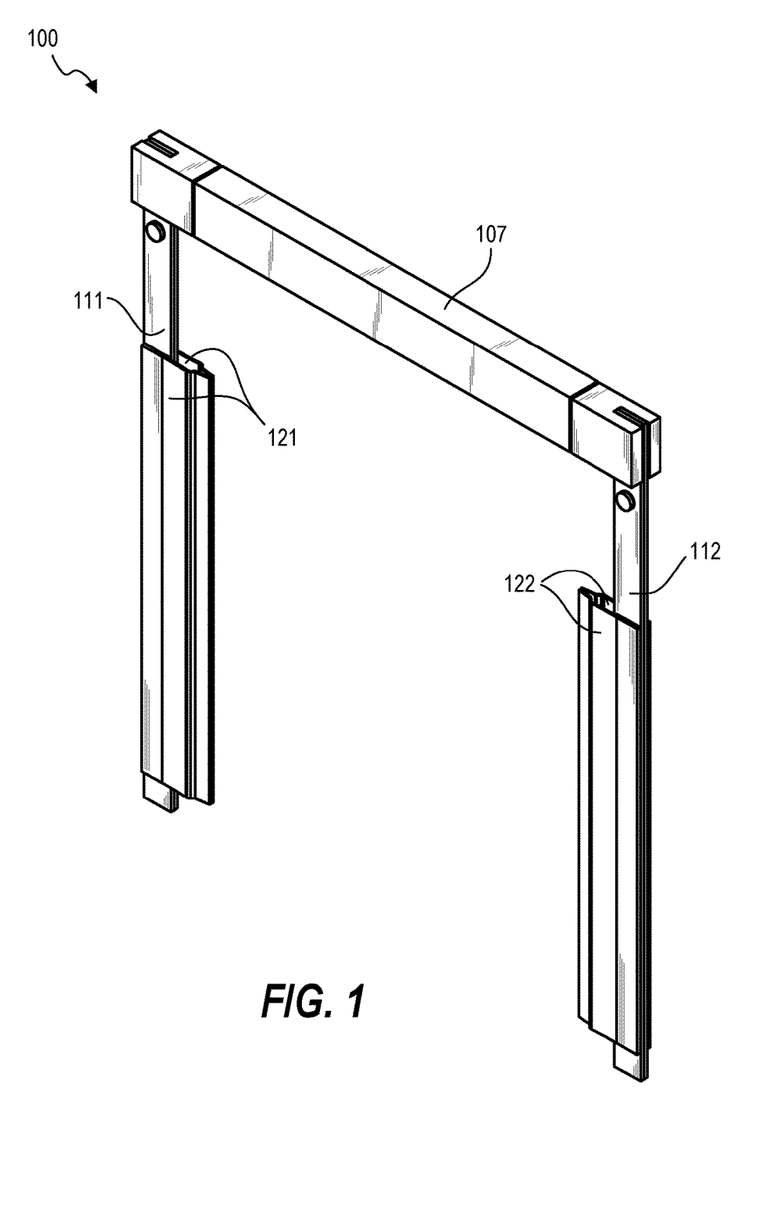
FIG. 1 is a perspective view of a workpiece holder according to embodiments disclosed herein.
Figure 2:
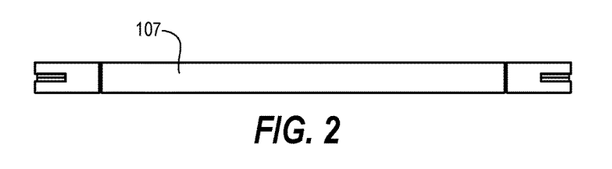
FIG. 2 is a top view of a workpiece holder according to embodiments disclosed herein.
Figures 3, 4:
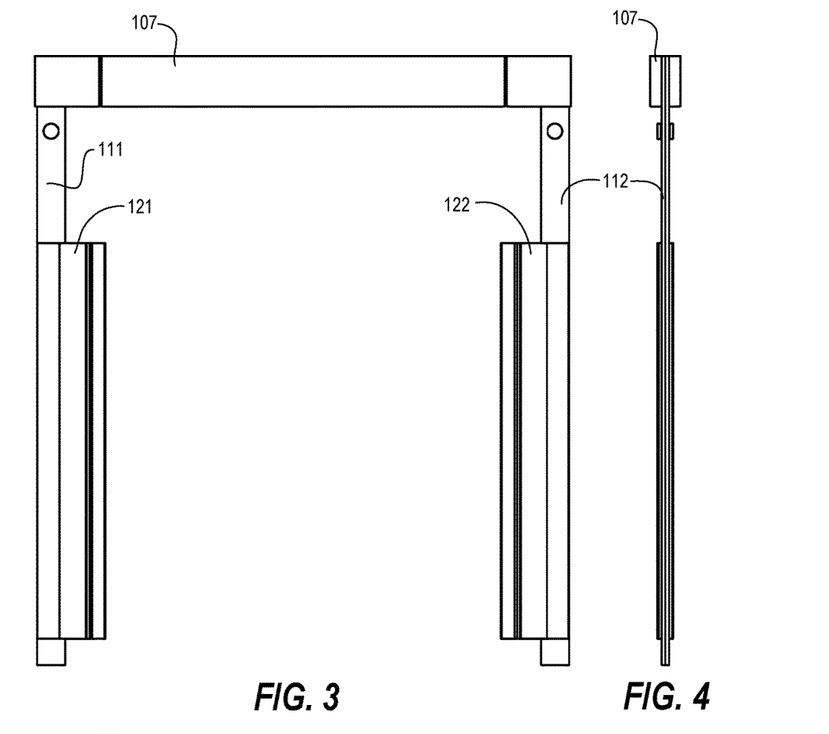
FIG. 3 is a front view of a workpiece holder according to embodiments disclosed herein.
FIG. 4 is a side view of a workpiece holder according to embodiments disclosed herein.
Figure 5:
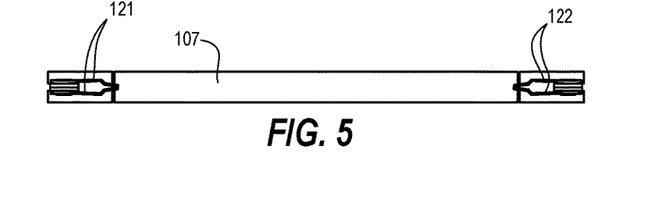
FIG. 5 is a bottom view of a workpiece holder according to embodiments disclosed herein.

Now, more specifically, referring to FIGS. 1-5, an example workpiece holder 100 is illustrated. FIG. 1 is a perspective view, FIG. 2, is a top view, FIG. 3 is a front view, FIG. 4 is a side view, and FIG. 5 is a bottom view. Included is a workpiece holder frame configured to hold a workpiece by gripping the workpiece on opposing sides of the work piece. The workpiece holder frame includes a header member 107 configured to be gripped and transported to and from a processing cell. Such a processing cell can be capable of processing the workpiece on opposing surfaces of the workpiece. In other words, an electroplating solution can be in contact with one or both planar surfaces of the workpiece when lowered in a processing cell. Such configuration can help plating operations that involves filling panel through-holes with metal.

A first flexure leg 111 extends from a first end of the header member 107. The first flexure leg 111 is configured to grip a first edge of the workpiece. The first flexure leg 111 has a first pair of flexure contact seal strips 121 attached along a length of the first flexure leg 111 such that, when in use, an inner edge of the first pair of flexure contact seal strips 121 sealably contacts opposing sides of the first edge of the workpiece and clamps the first edge there between. Such clamping will be described in more detail below.

The workpiece holder includes a second flexure leg 112 extending from a second end of the header member 107. The second flexure leg 112 is configured to grip a second edge of the workpiece. The second flexure leg 112 has a second pair of flexure contact seal strips 122 attached along a length of the second flexure leg 112 such that, when in use, an inner edge of the second pair of flexure contact seal strips 122 sealably contacts opposing sides of the second edge of the workpiece and clamps the second edge there between.

The header member 107 can include a spring member configured to provide tension to a workpiece when being held. For example, header member 107 can include one or more springs designed for compression and tension. The header member 107 can be compressed, which moves flexure legs closer together. This compression essentially functions to pre-tension the workpiece holder. After a workpiece is clamped within the flexure contact seal strips, the header member 107 can be released resulting in an internal spring (s) or other tension mechanism imparting a tensile force to the flexure legs and, in turn, imparting tension to a workpiece held there between. In other embodiments, the workpiece holder itself (without using a spring) can be configured to provide tension to a workpiece. For example, construction and selection of material can be such as to have either a tendency for the flexure legs to push outwardly (away from each other) or to at least resist being pressed toward each other. Accordingly, the first flexure leg 111 and the second flexure leg 112 can be pressed toward each other prior to clamping on a workpiece such that upon releasing the flexure members, the workpiece holder imparts tension to a given workpiece being held. The header member 107 can include any number of geometries, shapes, openings, grips, or protrusions to make handling of the workpiece holder by a transport system more convenient. The workpiece holder can also include an identification element, such as a radio frequency tag, to uniquely identify each workpiece holder.

Figure 6:
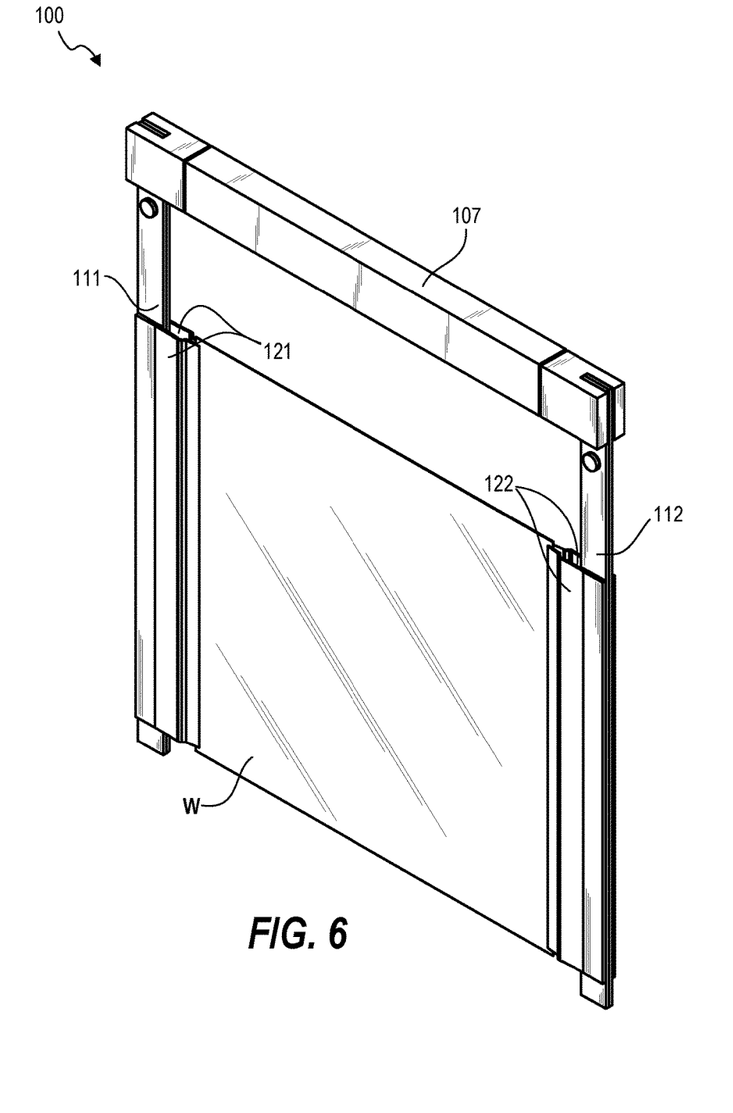
FIG. 6 is a perspective view of a workpiece holder holding a workpiece according to embodiments disclosed herein.
Figure 7:
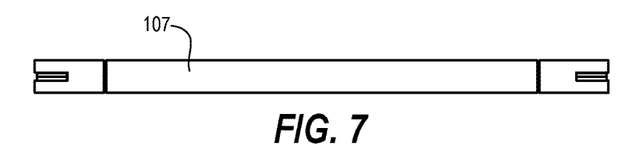
FIG. 7 is a top view of a workpiece holder holding a workpiece according to embodiments disclosed herein.
Figures 8, 9:
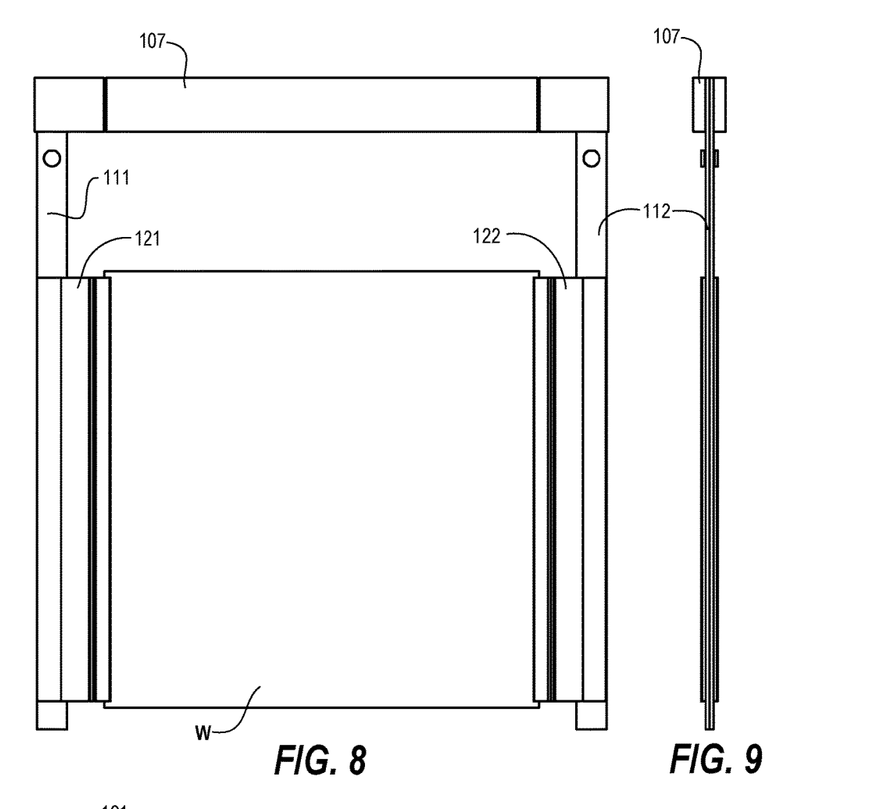
FIG. 8 is a front view of a workpiece holder holding a workpiece according to embodiments disclosed herein.
FIG. 9 is a side view of a workpiece holder holding a workpiece according to embodiments disclosed herein.
Figure 10:
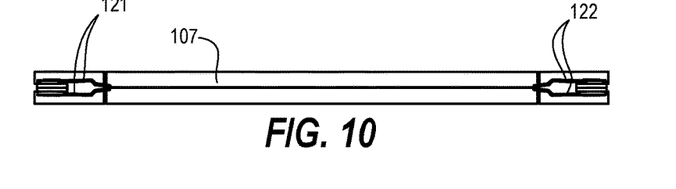
FIG. 10 is a bottom view of a workpiece holder holding a workpiece according to embodiments disclosed herein.

FIGS. 6-10 illustrate workpiece holder 100 holding workpiece W. FIG. 6 is a perspective view, FIG. 7, is a top view, FIG. 8 is a front view, FIG. 9 is a side view, and FIG. 10 is a bottom view. Note that workpiece W is held within the frame defined by workpiece holder 100, and positioned between the flexure legs 111 and 112, and with flexure contact seal strips 121 and 122 mechanically holding workpiece W.

Figure 11:
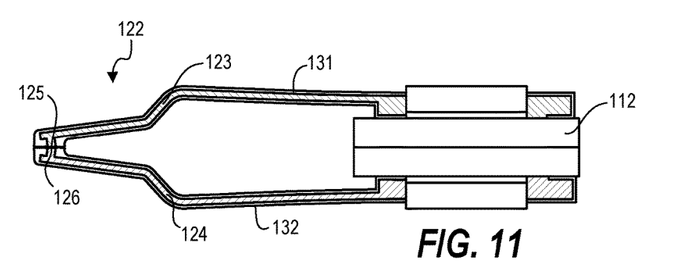
FIG. 11 is a top view with partial cross section of a closed clamping mechanism according to embodiments disclosed herein.

Referring now to FIG. 11, a partial cross-sectional top view of the second flexure leg 112 is illustrated, which also shows a cross section of the second pair of contact seal strips 122. Note that each flexure structure includes a conductive member 123 or conductive member 124, which can be any of various conductive metals. Each flexure structure, to provide mechanical energy, can be comprised of a flexible metal with the flexible metal providing both mechanical energy for holding workpiece W, and an electrical conduit for delivering an electrical current to workpiece W. In other embodiments, the flexure structures (flexure contact seal strips) can be a polymer, plastic or other elastically flexible material with internally positioned wires for conducting current to the contacts.

Figure 17:
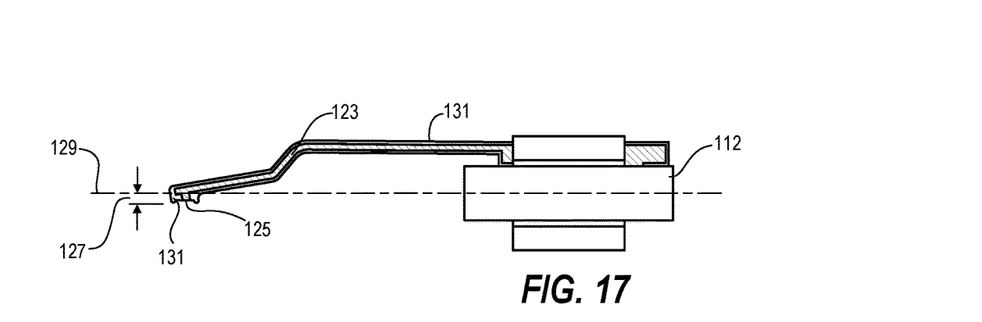
FIG. 17 is a top view with partial cross section of a clamping mechanism illustrating flexure according to embodiments disclosed herein.

In one embodiment, the mechanical energy can be provided by opposing flexure structures and material properties of the flexure structures themselves. For example, FIG. 17 illustrates a second flexure leg 112, but with one of the flexure structures removed so that there is no counterpart to oppose the flexure structure. Line 129 illustrates a center line of the second flexure leg 112. Note that without an opposing flexure structure, it can be seen that the existing flexure structure is mounted such that contact 125 travels beyond line 129. Reference 127 in FIG. 17 illustrates this deflection distance. Thus, in an unloaded and unopposed state, contact 125 rests beyond a centerline or location of contacting workpiece W. A second flexure structure can then be similarly positioned but at an opposing location. The result is that each flexure structure pushes the other back thereby storing mechanical energy in that the flexure structures passively and constantly push against each other. This creates a passive clamping mechanism that does not require additional forces, electricity, pressures, etc. to maintain in a clamped configuration.

Figure 12:
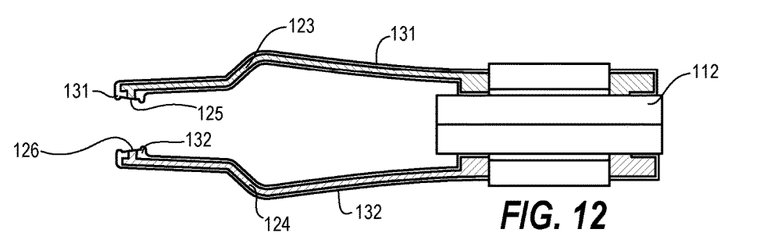
FIG. 12 is a top view with partial cross section of an open clamping mechanism according to embodiments disclosed herein.

FIG. 11 illustrates that in a passive position, and without holding a workpiece W, contact 125 and contact 126 press against each other. Contacts 125 and 126 can each be embodied as a continuous electrical strip running a length of each respective flexure structure, or can be an array of contact point locations such as a line of exposed metal points, dots, or fingers. Respective flexure structures can be coated with insulator 131 and insulator 132. These insulators can be any of various elastomers that can cover exposed portions of the flexure structures except at contacts 125 and 126. Note in FIG. 12 that insulator 131 and insulator 132 extend beyond (farther) than a surface of contacts 125 and 126. Such a configuration enables a fluid seal between the flexure structures and a given workpiece as the flexure structures press against a workpiece surface. With a given insulator selected as an elastomer or material that is otherwise deformable, a fluid seal can be created around contacts as the insulator is pressed against a workpiece.

Figure 13:
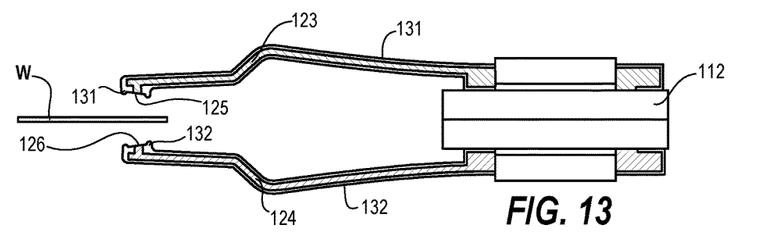
FIG. 13 is a top view with partial cross section of an open clamping mechanism receiving a workpiece according to embodiments disclosed herein.
Figure 14:
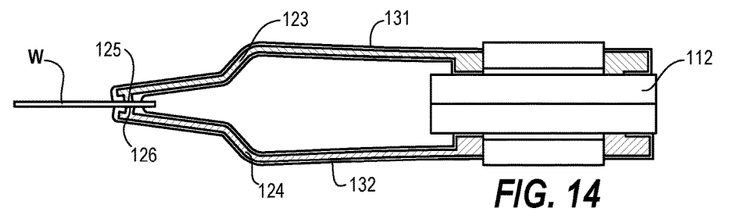
FIG. 14 is a top view with partial cross section of a closed clamping mechanism holding a workpiece according to embodiments disclosed herein.

FIG. 13 illustrates the flexure structures being separated and an edge of workpiece W being positioned between contacts 125 and 126. With workpiece W in position, the flexure structures are released which causes the flexure structures to contact workpiece W, as shown in FIG. 14. Note that when the flexure structures clamp on the workpiece W, the clamping force helps create a fluid seal around contacts 125 and 126 by elastically deforming the insulators 131 and 132. In some embodiments, the contacts can include an elastomer-coated conductive member having an assembly of inwardly extending flexible fingers at the inner edge of the first and second pair of flexure contact seal strips. When the workpiece W is loaded in the workpiece holder, the assembly of inwardly extending flexible fingers electrically contacts opposing sides of first and second edges of the workpiece W. The elastomer-coated conductive member can include an elastomeric sealing bead that sealably contacts the opposing sides of the first and second edges of the workpiece and sealably surrounds each assembly of inwardly extending flexible fingers when making contact to the workpiece.

With the workpiece clamped, conductive members 123 and 124 each provide an electrical conduit between second flexure leg 112 and workpiece W. Second flexure leg 112 can in turn provide an internal electrical conduit to an electrical source, which can include routing a conductor to the header member 107. A transportation connector that connects with the workpiece holder at the header member 107, can also include electrical connections so that electricity can be delivered to the workpiece holder via the header member. For example, electricity can be routed from the header member to the assembly of inwardly extending flexible fingers at the inner edge of the first and second flexure contact strips (flexure structures). With a conductive member of the first and second flexure legs being coated with an electrically insulating material, when the first and second flexure contact strips are immersed in an electrochemical deposition processing fluid, the immersed portion of the workpiece holder is electrically insulated from the processing fluid within the processing cell. In other embodiments, electrical connections can be established directly with the flexure legs during plating. In embodiments using a line of individual contact points, each contact can be connected to a same electricity source for equal current distribution, or, alternatively, each contact or finger can be individually addressable to provide more or less current to a given contact point along the edge of the workpiece. In other embodiments, each side (line of contact points) of the workpiece can have independent current control so that more or less metal can be plated on each side of the workpiece.

Figure 15:
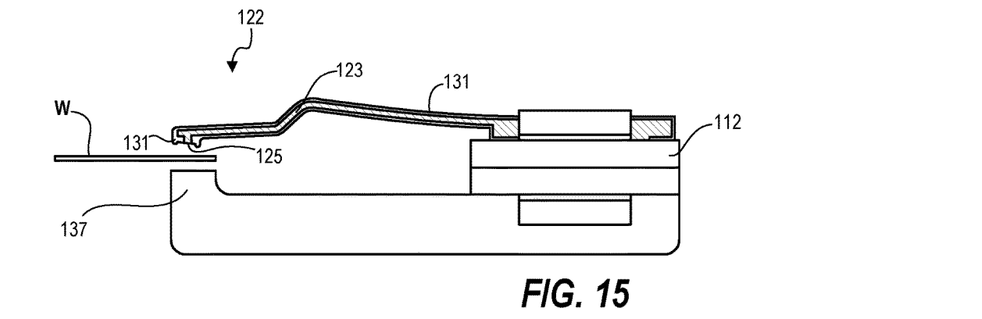
FIG. 15 is a top view with partial cross section of an open clamping mechanism receiving a workpiece according to embodiments disclosed herein.
Figure 16:
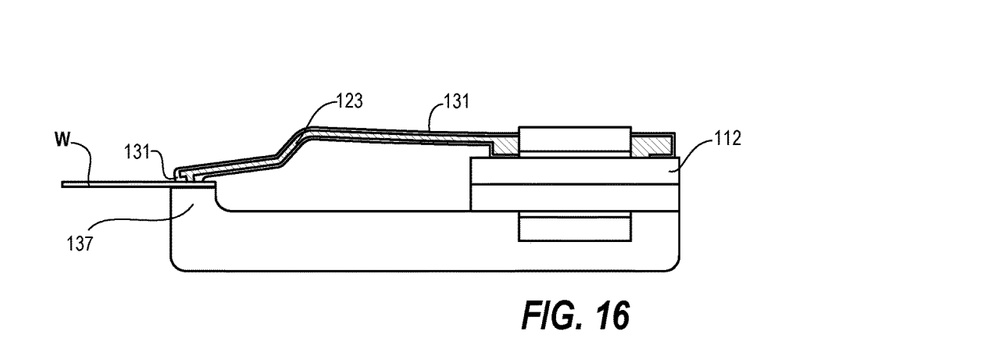
FIG. 16 is a top view with partial cross section of a closed clamping mechanism holding a workpiece according to embodiments disclosed herein.

Other embodiments can be configured to enable electroplating on just one side of workpiece W. FIG. 15 illustrates a clamping mechanism in which an electrical connection is made to only one side of workpiece W. FIG. 15 shows a flexure structure in an open position to receive workpiece W. Such a clamping mechanism can function similar to that already described. One difference is that a rigid support member 137 opposes the flexure structure instead of using a pair of flexure structures. FIG. 16 illustrates this single flexure structure in a clamped position, which includes holding workpiece W and providing an electrical connection to workpiece W.

Figure 21:
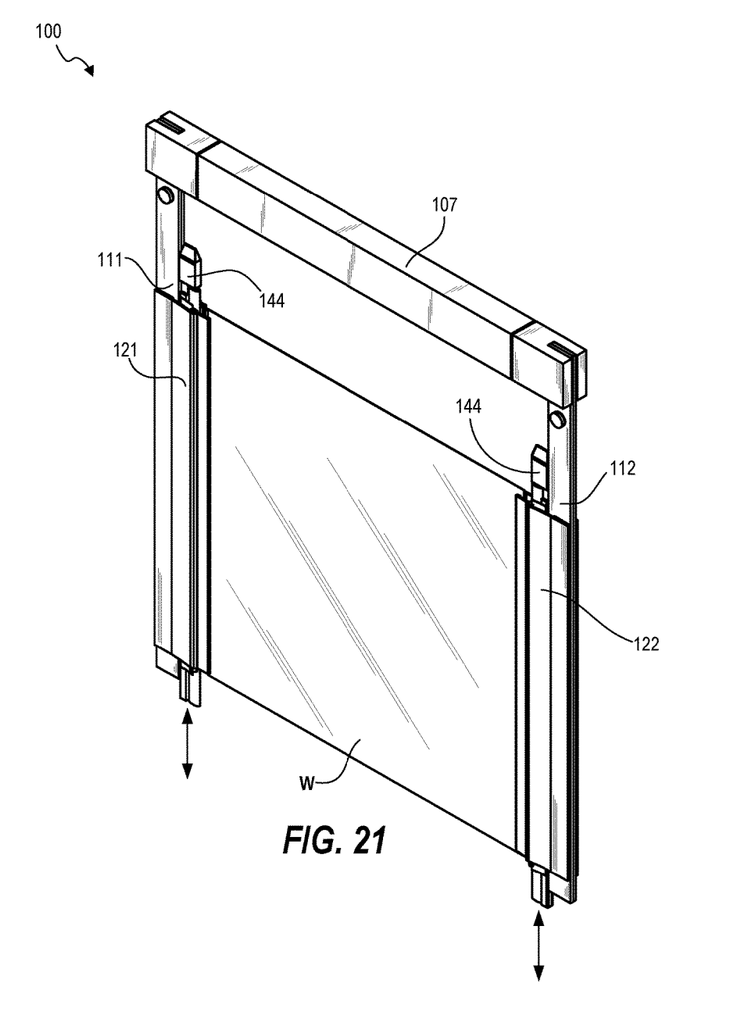
FIG. 21 is a perspective view of a workpiece holder with inserted expansion mechanism and holding a workpiece according to embodiments disclosed herein.

With the clamping mechanism being passively clamped, an active mechanism can be used to open the clamping mechanism to receive a workpiece or release a workpiece. There are various mechanisms that can be used to open the clamping mechanism. Such an active mechanism can include mechanical, pneumatic, and hydraulic systems. One example system is a pneumatic opener. The workpiece holder can be configured such that the first and second pairs of flexure contact seal strips define an opening between each other. An elongated actuation member 144 is then inserted into the defined opening between each pair of flexure contact seal strips along a length of the first and second flexure legs during loading and unloading of the workpiece. FIG. 21 illustrates elongated actuation member 144 having been inserted within an opening in a central portion of the clamping mechanism. Note that depending on a particular electrochemical deposition system, either the elongated actuation member 144 can move toward the workpiece holder 100, or the workpiece holder 100 can move toward the elongated actuation member 144.

Figure 18:
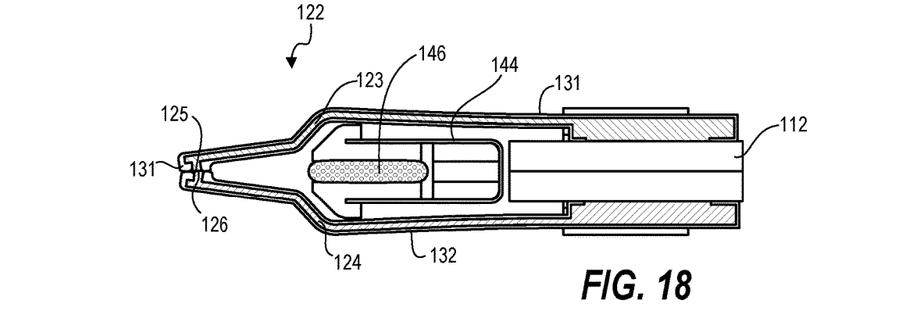
FIG. 18 is a top view with partial cross section of a closed clamping mechanism with expansion mechanism inserted according to embodiments disclosed herein.
Figure 19:
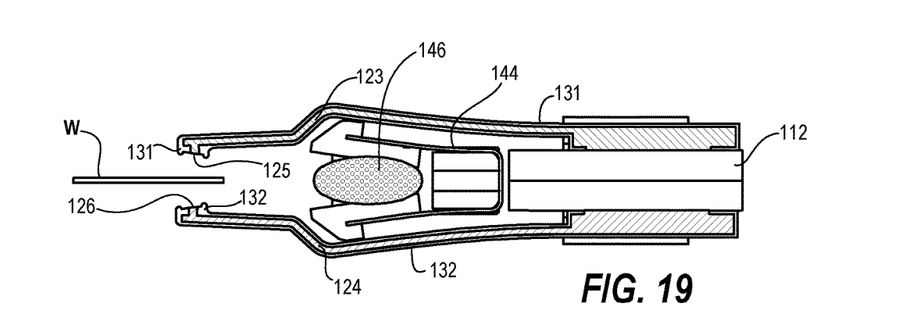
FIG. 19 is a top view with partial cross section of an open clamping mechanism opened with expansion mechanism and receiving a workpiece according to embodiments disclosed herein.
Figure 20:
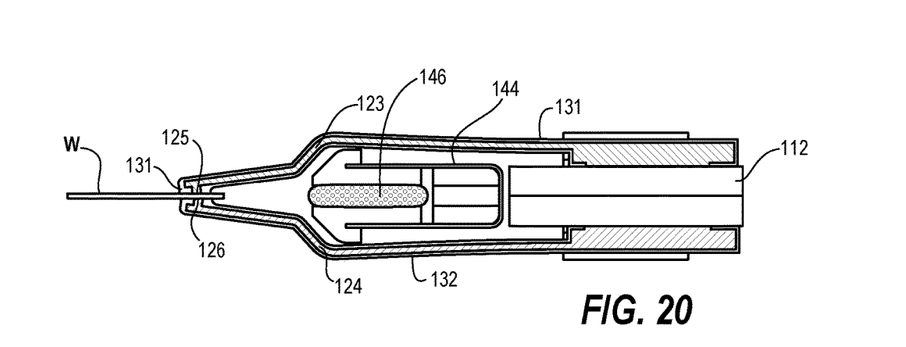
FIG. 20 is a top view with partial cross section of a closed clamping mechanism holding a workpiece with expansion mechanism inserted according to embodiments disclosed herein.

FIG. 18 shows a cross-sectional view of a clamping mechanism having elongated actuation member 144 inserted between flexure structures of a clamping mechanism. Elongated actuation member 144 is embodied as a pneumatic system that includes bladder 146. Referring now to FIG. 19, bladder 146 is inflated. This inflation laterally expands the elongated actuation member 144, which causes the flexure structures or clamping mechanism to open (contacts 125 and 126 separate from each other) to receive workpiece W. With workpiece W positioned within the clamping mechanism, the bladder 146 is deflated, which allows the flexure structures to return and then clamp the workpiece W between each other, thereby holding the workpiece and providing an electrical connection, as shown in FIG. 20. After the workpiece W is securely clamped, the elongated actuation member 144 can then be removed.

The workpiece holder 100 can then be transported to one or more electrochemical deposition plating cells or tanks and lowered therein. Electrochemical deposition can then be executed with current flowing across the workpiece from the clamping mechanism. After a given electrochemical deposition process is completed, the workpiece holder can be transported to a cleaning and/or drying station. The workpiece holder can then transport the held and plated workpiece to an unloading area, and the clamping mechanism is released to free the workpiece, which can then be transported to packaging and/or additional processing.

In another embodiment, a workpiece holder includes a header member that is elongated. The header member has a first end and a second end that are longitudinally opposite each other. The header member can optionally include a tensioner configured to expand or contract the header member longitudinally. For example, the header member can include one or more springs, a pneumatic expander, etc. A first leg member extends from the first end of the header member and is perpendicular to the header member. A second leg member extends from the second end of the header member and is perpendicular to the header member such that the first leg member and the second leg member extend in a same direction and are in plane with each other.

The first leg member having a first clamping mechanism and the second leg member having a second clamping mechanism. Each clamping mechanism has opposing clamping contacts that are electrically conductive. Each clamping mechanism is configured to apply a constant clamping force between the opposing clamping contacts. Each clamping mechanism is configured such that the opposing clamping contacts are sufficiently separable to receive a workpiece between the opposing clamping contacts. The workpiece herein is generally planar. Each clamping mechanism has sufficient force to hold the workpiece. Each clamping mechanism further includes a seal configured to provide a fluid seal around the opposing clamping contacts when the opposing clamping contacts are holding the workpiece. This enables the workpiece to be lowered into electrochemical deposition fluid without the fluid reaching the clamping contacts, thereby preventing undesirable plating on the contacts themselves. For example, the opposing clamping contacts can include an elastomer-coated conductive member having a line of contact points configured such that each clamping mechanism contacts opposing sides of the workpiece on first and second edges of the workpiece.

The elastomer-coated conductive member can include an elastomeric sealing bead that sealably contacts opposing sides of the first and second edges of the workpiece and sealably surrounds each line of contact points, or each individual contact point, when making contact to the workpiece. In another embodiment, each clamping mechanism is coated with electrically insulating material such that when the workpiece—held by each clamping mechanism—is immersed in a fluid medium of a process cell, immersed portions of each clamping mechanism and conductive material within each clamping mechanism are electrically insulated from the fluid medium within a processing cell.

The clamping mechanisms are configured to hold the workpiece between the first leg member and the second leg member. The tensioner or the workpiece holder itself can be configured to impart tension to the workpiece when the workpiece is held between the first leg member and the second leg member. Such tension can create a more planar surface (for relatively flexible workpieces) and reduce any warpage.

When the workpiece is held between the first leg member and the second leg member, the workpiece provides an electrical path between clamping contacts of the first leg member and clamping contacts of the second leg member such that an electrical current applied to either clamping mechanism travels through the workpiece when the workpiece is conductive or has a conductive surface. The first and second leg members can optionally include a conductive member that electrically provides electrical continuity from the header member to the clamping contacts.

Each clamping mechanism can define a cavity or space sized to receive an elongate actuation member configured to separate opposing clamping contacts for receiving and removing the workpiece when the elongate actuation member is expanded. The elongate actuation member is configured to release the opposing clamping contacts to hold the workpiece when the workpiece is positioned between the opposing clamping contacts. The elongate actuation member can be configured to be expanded by inflation and contracted by deflation.

The header member can be configured to be coupled to a transportation system, such as by having handles, actuated grips, etc. The transportation system is configured to transport the workpiece holder to a processing cell containing a fluid medium, lower the workpiece holder at least partially into the fluid medium, and remove the workpiece holder from the processing cell. The header member can include a readable identification element that uniquely identifies the workpiece holder.

Another embodiment includes a workpiece holder assembly that includes a workpiece holder having a workpiece holder frame configured to hold a workpiece by gripping the workpiece on opposing sides of the workpiece. The workpiece holder frame has a header member configured to be gripped and transported to and from a processing cell capable of processing the workpiece on opposing surfaces of the workpiece. A first flexure leg extends from a first end of the header member, and is configured to grip a first edge of the workpiece. The first flexure leg has a first pair of flexure contact seal strips attached along a length of the first flexure leg such that, when in use, an inner edge of the first pair of flexure contact seal strips sealably contacts opposing sides of the first edge of the workpiece and clamps the first edge there between. A second flexure leg extends from a second end of the header member and is configured to grip a second edge of the workpiece. The second flexure leg has a second pair of flexure contact seal strips attached along a length of the second flexure leg such that, when in use, an inner edge of the second pair of flexure contact seal strips sealably contacts opposing sides of the second edge of the workpiece and clamps the second edge there between.

The workpiece holder assembly also includes a loader assembly having a pair of elongate actuation members that are insertable within a void between each pair of flexure contact seal strips along a length of first and second flexure legs during loading and unloading of the workpiece. Each elongate actuation member includes a bladder that is inflatable and deflatable during loading and unloading operations.

Techniques herein can also include methods of handling and transporting workpieces. One such embodiment is a method of loading a workpiece into a workpiece holder. An empty workpiece holder is received. The workpiece holder includes a workpiece holder frame configured to hold a workpiece by gripping the workpiece on opposing sides of the workpiece. The workpiece holder frame has a header member configured to be gripped and transported to and from a processing cell capable of processing the workpiece on opposing surfaces of the workpiece. The workpiece holder includes a first flexure leg extending from a first end of the header member, and configured to grip a first edge of the workpiece. The first flexure leg has a first pair of flexure contact seal strips attached along a length of the first flexure leg such that, when in use, an inner edge of the first pair of flexure contact seal strips sealably contacts opposing sides of the first edge of the workpiece and clamps the first edge there between. The workpiece holder includes a second flexure leg extending from a second end of the header member and configured to grip a second edge of the workpiece. The second flexure leg has a second pair of flexure contact seal strips attached along a length of the second flexure leg such that, when in use, an inner edge of the second pair of flexure contact seal strips sealably contacts opposing sides of the second edge of the workpiece and clamps the second edge there between.

An elongate actuation member can be inserted into a void between each pair of flexure contact seal strips along a length of first and second flexure legs of the empty workpiece holder. A bladder housed within each elongate actuation member is inflated such that the flexure contact seal strips for each pair of flexure contact seal strips expand outwardly in opposing direction to create a gap between opposite facing contact seals at the inner edge of the first and second pair of flexure contact seal strips. The workpiece is inserted into the workpiece holder such that first and second edges of the workpiece slide within the gap between opposite facing contact seals at the inner edge of the first and second pair of flexure contact seal strips. The bladder housed within each elongate actuation member is deflated to cause the first and second pair of flexure contact seal strips to grip the first and second edges of the workpiece.

Another embodiment includes a method of unloading a workpiece from a workpiece holder. This method includes receiving a workpiece holder holding a workpiece. The workpiece holder includes a workpiece holder frame configured to hold a workpiece by gripping the workpiece on opposing sides of the workpiece. The workpiece holder frame has a header member configured to be gripped and transported to and from a processing cell capable of processing the workpiece on opposing surfaces of the workpiece. The workpiece holder includes a first flexure leg extending from a first end of the header member and configured to grip a first edge of the workpiece. The first flexure leg having a first pair of flexure contact seal strips attached along a length of the first flexure leg such that, when in use, an inner edge of the first pair of flexure contact seal strips sealably contacts opposing sides of the first edge of the workpiece and clamps the first edge there between. The workpiece holder includes a second flexure leg extending from a second end of the header member and configured to grip a second edge of the workpiece. The second flexure leg has a second pair of flexure contact seal strips attached along a length of the second flexure leg such that, when in use, an inner edge of the second pair of flexure contact seal strips sealably contacts opposing sides of the second edge of the workpiece and clamps the second edge there between.

An elongate actuation member is inserted into a void between each pair of flexure contact seal strips along a length of first and second flexure legs of an empty workpiece holder. A bladder housed within each elongate actuation member is inflated such that the flexure contact seal strips for each pair of flexure contact seal strips expand outwardly in opposing directions to create a gap between opposite facing contact seals at the inner edge of the first and second pair of flexure contact seal strips. The workpiece is retracted from the workpiece holder (or the workpiece holder is retracted from the workpiece) such that first and second edges of the workpiece slide out from within the gap between opposite facing contact seals at the inner edge of the first and second pair of flexure contact seal strips. The bladder housed within each elongate actuation member is deflated causing the first and second pair of flexure contact seal strips to contact one another.

Accordingly, techniques herein can be used to hold and transport workpieces including flexible panels. Workpiece holders herein can carry a given workpiece through an electrochemical deposition system, while making sealed electrical contact with the workpiece. Empty workpiece holders can be kept in a storage buffer prior to use, and then be transported to and from plating tanks as needed. Workpieces can be held herein under tension and held with a failsafe clamping mechanism that passively applies clamping pressure and that can be opened with a relatively simple opening mechanism. Thus workpiece holders herein enable reliable and accurate plating of various workpieces.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Workpiece," "substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A workpiece holder comprising:
a workpiece holder frame configured to hold a workpiece by gripping the workpiece on opposing sides of the workpiece, the workpiece holder frame having a header member configured to be gripped and transported to and from a processing cell capable of processing the workpiece on opposing surfaces of the workpiece;
a first flexure leg extending from a first end of the header member, and configured to grip a first edge of the workpiece, the first flexure leg having a first pair of flexure contact seal strips attached along a length of the first flexure leg such that, when in use, an inner edge of the first pair of flexure contact seal strips sealably contacts opposing sides of the first edge of the workpiece and clamp the first edge there between; and
a second flexure leg extending from a second end of the header member, and configured to grip a second edge of the workpiece, the second flexure leg having a second pair of flexure contact seal strips attached along a length of the second flexure leg such that, when in use, an inner edge of the second pair of flexure contact seal strips sealably contacts opposing sides of the second edge of the workpiece and clamp the second edge there between;
wherein the first and second pairs of flexure contact seal strips each includes an elastomer-coated conductive member including an elastomeric sealing bead that sealably contacts the opposing sides of the first and second edges of the workpiece.

2. The workpiece holder of claim 1, wherein the header member includes a spring member that, once the workpiece is loaded in the workpiece holder, the spring member causes the first and second flexure legs to stretch the workpiece there between.

3. The workpiece holder of claim 1, wherein the header member includes a readable identification element that uniquely identifies the workpiece holder.

4. The workpiece holder of claim 3, wherein the readable identification element includes a radio frequency (RF) tag.

5. The workpiece holder of claim 1, wherein the elastomer-coated conductive member having an assembly of inwardly extending flexible fingers at the inner edge of the first and second pair of flexure contact seal strips, and wherein, once the workpiece is loaded in the workpiece holder, the assembly of inwardly extending flexible fingers electrically contacts opposing sides of first and second edges of the workpiece.

6. The workpiece holder of claim 5, wherein the elastomeric sealing bead sealably surrounds each assembly of inwardly extending flexible fingers when making contact to the workpiece.

7. The workpiece holder of claim 5, wherein the first and second flexure legs include a conductive member that electrically contacts first and second flexure strips creating electrical continuity from the header member to the assembly of inwardly extending flexible fingers at the inner edge of the first and second flexure contact seal strips, and wherein the conductive member of the first and second flexure legs is coated with an electrically insulating material such that together with elastomer-coated conductive members of the first and second flexure contact seal strips an immersed portion of the workpiece holder is electrically insulated from a fluid medium within the processing cell.

8. The workpiece holder of claim 1 further comprises an elongate actuation member;
wherein the first and second pairs of flexure contact seal strips include a void between inner surfaces of the first and second pairs of flexure contact seal strips such that the elongate actuation member is inserted into the void between each pair of flexure contact seal strips along the length of the first and second flexure legs during loading and unloading of the workpiece.

9. A workpiece holder comprising:
a header member that is elongated, the header member having a first end and a second end that are longitudinally opposite each other;
a first leg member extending from the first end of the header member and being perpendicular to the header member;
a second leg member extending from the second end of the header member and being perpendicular to the header member such that the first leg member and the second leg member extend in a same direction and are in plane with each other;
the first leg member having a first clamping mechanism and the second leg member having a second clamping mechanism, each clamping mechanism having opposing clamping contacts that are electrically conductive, each clamping mechanism configured to apply a constant clamping force between the opposing clamping contacts, each clamping mechanism configured such that the opposing clamping contacts are sufficiently separable to receive a workpiece between the opposing clamping contacts, the workpiece being planar, each clamping mechanism having sufficient force to hold the workpiece, each clamping mechanism including a seal configured to provide a fluid seal around the opposing clamping contacts when the opposing clamping contacts are holding the workpiece;

the first clamping mechanism and the second clamping mechanism being configured to hold the workpiece between the first leg member and the second leg member; and when the workpiece is held between the first leg member and the second leg member, the workpiece provides an electrical path between clamping contacts of the first leg member and clamping contacts of the second leg member such that an electrical current applied to either clamping mechanism travels through the workpiece when the workpiece includes a conductive surface;

wherein the opposing clamping contacts each includes an elastomer-coated conductive member including an elastomeric sealing bead that sealably contacts the opposing sides of the first and second edges of the workpiece.

10. The workpiece holder of claim 9, wherein the elastomer-coated conductive member includes a line of contact points configured such that each clamping mechanism contacts opposing sides of the workpiece on first and second edges of the workpiece when holding the workpiece.

11. The workpiece holder of claim 10, wherein the elastomeric sealing bead sealably surrounds each line of contact points when making contact to the workpiece.

12. The workpiece holder of claim 9, wherein the first and second leg members include a conductive member that provides electrical continuity from the header member to the clamping contacts.

13. The workpiece holder of claim 9, wherein each clamping mechanism is coated with electrically insulating material such that when the workpiece, held by each clamping mechanism, is immersed in a fluid medium of a process cell, immersed portions of each clamping mechanism and conductive material within each clamping mechanism are electrically insulated from the fluid medium within a processing cell.

14. The workpiece holder of claim 9 further comprises an elongate actuation member;

wherein each clamping mechanism defines a cavity sized to receive an elongate actuation member configured to separate opposing clamping contacts for receiving and removing the workpiece when the elongate actuation member is expanded, the elongate actuation member configured to release the opposing clamping contacts to hold the workpiece when the workpiece is positioned between the opposing clamping contacts.

15. The workpiece holder of claim 14, wherein the elongate actuation member is configured to be expanded by inflation and contracted by deflation.

16. The workpiece holder of claim 9, wherein the header member is configured to be coupled to a transportation system, the transportation system configured to transport the workpiece holder to a processing cell containing a fluid medium, lower the workpiece holder at least partially into the fluid medium, and remove the workpiece holder from the processing cell, the header member includes a readable identification element that uniquely identifies the workpiece holder.

17. The workpiece holder of claim 9, wherein the header member includes a tensioner configured to expand or contract the header member longitudinally, the tensioner configured to impart tension to the workpiece when the workpiece is held between the first leg member and the second leg member.

18. A workpiece holder assembly, comprising:
a workpiece holder including:
a workpiece holder frame configured to hold a workpiece by gripping the workpiece on opposing sides of the workpiece, the workpiece holder frame having a header member configured to be gripped and transported to and from a processing cell capable of processing the workpiece on opposing surfaces of the workpiece;
a first flexure leg extending from a first end of the header member, and configured to grip a first edge of the workpiece, the first flexure leg having a first pair of flexure contact seal strips attached along a length of the first flexure leg such that, when in use, an inner edge of the first pair of flexure contact seal strips sealably contacts opposing sides of the first edge of the workpiece and clamp the first edge there between; and
a second flexure leg extending from a second end of the header member, and configured to grip a second edge of the workpiece, the second flexure leg having a second pair of flexure contact seal strips attached along a length of the second flexure leg such that, when in use, an inner edge of the second pair of flexure contact seal strips sealably contacts opposing sides of the second edge of the workpiece and clamp the second edge there between; and
a loader assembly including:
a pair of elongate actuation members that are insertable within a void between each pair of flexure contact seal strips along a length of first and second flexure legs during loading and unloading of the workpiece, each elongate actuation member including a bladder that is inflatable and deflatable during loading and unloading operations.

* * * * *